(12) United States Patent
Nakazumi (10) Patent No.: US 8,411,526 B2
(45) Date of Patent: Apr. 2, 2013

(54) STORAGE DEVICE, ELECTRONIC DEVICE, AND STORAGE DEVICE CONTROL METHOD

(75) Inventor: Shinichiro Nakazumi, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 73 days.

(21) Appl. No.: 13/187,365

(22) Filed: Jul. 20, 2011

(65) Prior Publication Data
US 2012/0063255 A1 Mar. 15, 2012

(30) Foreign Application Priority Data
Sep. 14, 2010 (JP) ................................ 2010-206119

(51) Int. Cl.
*G11C 5/14* (2006.01)
(52) U.S. Cl. ............... 365/228; 365/189.05; 365/230.08
(58) Field of Classification Search .................. 365/228, 365/189.05, 230.08
See application file for complete search history.

(56) References Cited

U.S. PATENT DOCUMENTS

| | | | | |
|---|---|---|---|---|
| 7,564,733 B2 * | 7/2009 | Pawlowski | ............... | 365/230.02 |
| 7,570,519 B2 * | 8/2009 | Surico et al. | ............. | 365/185.19 |
| 7,644,218 B2 * | 1/2010 | Deng et al. | ................ | 710/302 |
| 7,978,534 B2 * | 7/2011 | Pawlowski | ............... | 365/189.05 |

FOREIGN PATENT DOCUMENTS

| | | |
|---|---|---|
| JP | 06-332809 | 12/1994 |
| JP | 07-261887 | 10/1995 |
| JP | 2002-358169 | 12/2002 |
| JP | 2002-366265 | 12/2002 |
| JP | 2003-122647 | 4/2003 |
| JP | 2005-222202 | 8/2005 |
| JP | 2008-059007 | 3/2008 |
| JP | 2008-077669 | 4/2008 |
| JP | 2008-262350 | 10/2008 |
| JP | 2009-230407 | 10/2009 |

OTHER PUBLICATIONS

Japanese Office Action dated Nov. 29, 2011, filed in Japanese counterpart Application No. 2010-206119, 4 pages (with English translation).

* cited by examiner

*Primary Examiner* — Pho M Luu
(74) *Attorney, Agent, or Firm* — Patterson & Sheridan, LLP (57) ABSTRACT

A storage device includes a volatile memory, an auxiliary power source, a nonvolatile memory, a write module, and an inhibition module. The volatile memory stores user data. The auxiliary power source supplies power to the volatile memory when power from a main power source is cut off. The nonvolatile memory is written with the user data, write incomplete information indicating the user data, and power off information indicating that power from the main power source is cut off. While supplied with power from the auxiliary power source when power from the main power source is cut off, the write module writes the write incomplete information, the user data, and the power off information to the nonvolatile memory. The inhibition module inhibits reading of the user data if the power off information is not written in the nonvolatile memory when the volatile memory is supplied with power.

20 Claims, 6 Drawing Sheets

| Byte/Bit | 7 | 6 | 5 | 4 | 3 | 2 | 1 | 0 | |
|---|---|---|---|---|---|---|---|---|---|
| 0 h | | | | | | | | | HEADER |
| 1 h | | | | | | | | | |
| 2 h | | | | | | | | | |
| 3 h | | | | | | | | | |
| 4-7 h | | | | | | | | | |
| 8-B h | | | | | | | | | |
| C-F h | | | | | | | | | |
| 10 h | Reserved | | | | | | | Vaild | VALIDITY INFORMATION |
| 11 h | | | | | | | | | COPY OF WRITE INCOMPLETE TABLE |
| 12-17 h | Reserved | | | | | | | | |
| 18-1B h | Entry 0 LBA | | | | | | | | |
| 1C-1F h | Entry 0 TL | | | | | | | | |
| | | | | | | | | | |
| 510-513 h | Entry 159 LBA | | | | | | | | |
| 514-517 h | Entry 159 TL | | | | | | | | |
| 518-51B h | Check Sum | | | | | | | | FOOTER |

STORAGE DEVICE, ELECTRONIC DEVICE, AND STORAGE DEVICE CONTROL METHOD

CROSS-REFERENCE TO RELATED APPLICATIONS

This application is based upon and claims the benefit of priority from Japanese Patent Application No. 2010-206119, filed Sep. 14, 2010, the entire contents of which are incorporated herein by reference.

FIELD

Embodiments described herein relate generally to a storage device, an electronic device, and a storage device control method.

BACKGROUND

There have been known storage devices that are provided with a data buffer to improve the write performance to a nonvolatile memory such as a solid-state drive (SSD). When completing writing data to the data buffer, such a storage device notifies a host device of the completion of data write operation. Although a volatile memory that stores data when supplied with power from the main power source is used as the data buffer of the storage device, it loses the data if power from the main power source is cut off. Accordingly, the storage device needs a backup power source to supply power to the data buffer when power from the main power source is cut off. The backup power source has a power capacity enough to write back data yet to be written on the data buffer to the nonvolatile memory when power supply to the data buffer is cut off.

While a lithium-ion battery or a large-capacity capacitor is generally used as the backup power source, they both have a characteristic that, as charged/discharged repeatedly, they are deteriorated and the power capacity is reduced. As a result, in conventional storage devices, when the backup power source is deteriorated, all data on the data buffer may not be written back to the nonvolatile memory when power is cut off. Besides, if the storage device is rebooted when all data on the data buffer has not been written back to the nonvolatile memory, old data is read upon reading data that cannot be written back to the nonvolatile memory, resulting in data corruption.

To cope with this, a conventional storage device monitors the capacity of the backup power source at regular intervals, and outputs a warning if the capacity is reduced below a predetermined threshold. Further, the conventional storage device writes a mark (information) indicating that the storage device is turned off properly to the nonvolatile memory after writing back data on the data buffer to the nonvolatile memory. If the mark (information) is not written to the nonvolatile memory when the storage device is turned on, data reading is inhibited by placing the storage device in the state where it requires reformatting or is at fault to avoid data corruption.

The capacity of the backup power source is monitored based generally on the measurement results of the self-discharge time and full-discharge time of the backup power source. Since considerable time is taken to measure the self-discharge time of the backup power source, the monitoring of the capacity requires substantial time in the order of 100 seconds. On the other hand, while the full-discharge time of the backup power source is being measured, the backup power source cannot be used. During the period, the performance of the storage device is significantly degraded. Therefore, the full-discharge time cannot be measured frequently. That is, in the monitoring of the capacity of the backup power source, an interval at which the self-discharge time and full-discharge time can be measured is limited. In addition, power cannot be supplied from the backup power source to the data buffer during the interval.

To avoid data loss due to a sudden drop in power from the backup power source, a mark (information) indicating that the storage device is turned off is written to the nonvolatile memory. If the mark is not written to the nonvolatile memory when the storage device is turned on, even if it is because some kilobytes (KB) data of hundreds of gigabytes (GB) of storage capacity cannot be written back, access to all data in the storage device becomes available. If no data is written back to the storage device, also, access to all data in the storage device becomes available.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, a storage device comprises a volatile memory, an auxiliary power source, a nonvolatile memory, a write module, and an inhibition module. The volatile memory is configured to store user data. The auxiliary power source is configured to supply power to the volatile memory when power from a main power source to the volatile memory is cut off. The nonvolatile memory is configured to be written with the user data stored in the volatile memory, write incomplete information indicating the user data stored in the volatile memory, and power off information indicating that power from the main power source is cut off. The write module is configured to be supplied with power from the auxiliary power source when power from the main power source is cut off, to write the write incomplete information to the nonvolatile memory, to write the user data stored in the volatile memory to the nonvolatile memory after writing the write incomplete information, and to write the power off information to the nonvolatile memory after writing the user data. The inhibition module is configured to, if the power off information is not written in the nonvolatile memory when the volatile memory is supplied with power from the main power source, inhibit the user data indicated by the write incomplete information from being read from the nonvolatile memory.

Figure 1:
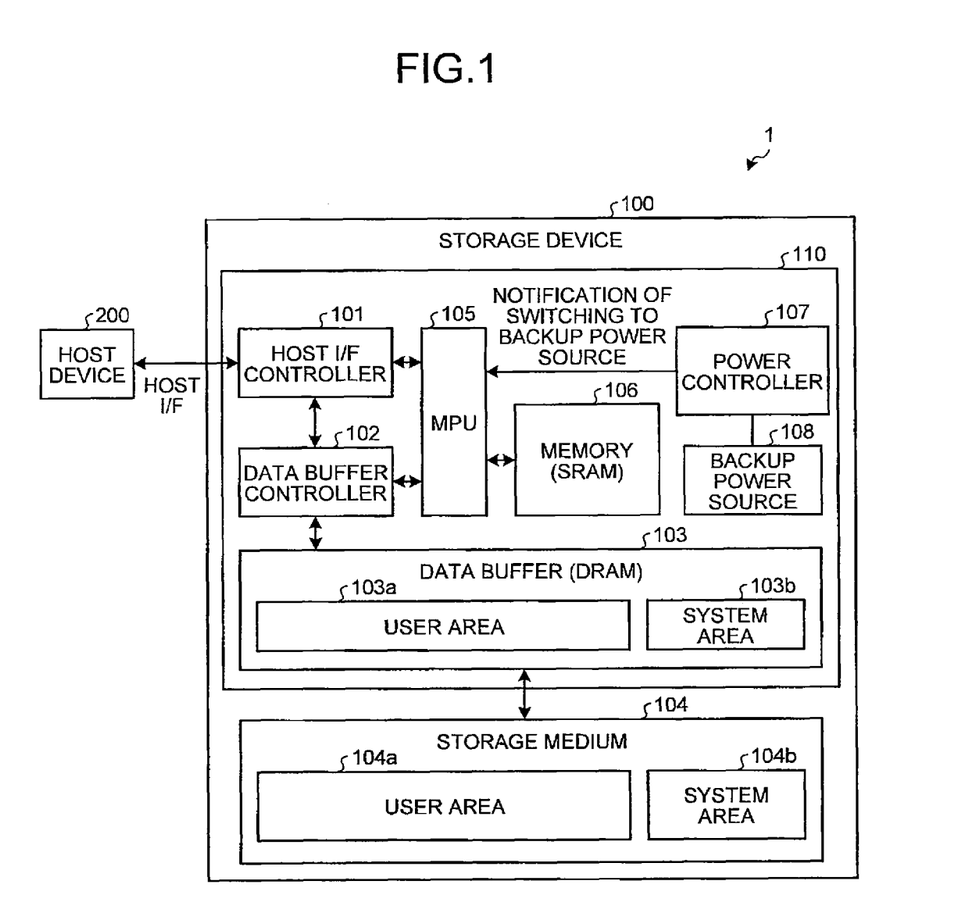
FIG. 1 is an exemplary block diagram of an electronic device according to an embodiment.

FIG. 1 is a block diagram of an electronic device 1 according to an embodiment. The electronic device 1 comprises a storage device 100 and a host device 200. The storage device 100 is a nonvolatile memory that stored information using a semiconductor memory such as, for example, a solid-state drive (SSD). The storage device 100 is connected via a communication medium, i.e., a host interface (I/F), to the host device 200, and functions as an external storage medium of the host device 200. The host device 200 may be, for example, a personal computer, a central processing unit (CPU) core, or the like.

The storage device 100 comprises a storage medium 104 and a controller 110. The storage medium 104 is a nonvolatile memory such as a NAND flash memory. The controller 110 controls user data write/read operation with respect to the storage medium 104. While the nonvolatile storage medium 104 is described herein as a NAND flash memory, it is not limited thereto and may be any other nonvolatile memory.

The controller 110 comprises a host I/F controller 101, a data buffer controller 102, a data buffer 103, a micro processing unit (MPU) 105, a memory 106, a power controller 107, and a backup power source 108. The data buffer 103 is a volatile memory such as a dynamic random access memory (DRAM). The MPU 105 functions as a controller. The memory 106 may be a static random access memory (SRAM) and operates faster than the storage medium 104.

The host I/F controller 101 is a memory link interface such as an advanced technology attachment (ATA) interface, and outputs a command, user data, and the like received from the host device 200 to the MPU 105 or the data buffer controller 102. Besides, the host I/F controller 101 sends user data received from the data buffer controller 102 and a response notification (notification indicating the completion of command execution, etc.) from the MPU 105 to the host device 200.

The MPU 105 controls the overall operation of the storage device 100. When the host I/F controller 101 receives a command from the host device 200, the MPU 105 controls the storage device 100 according to the command. For example, according to a command from the host device 200, the MPU 105 instructs the data buffer controller 102 to write/read user data to/from the storage medium 104.

The data buffer controller 102 writes/reads user data exchanged between the host device 200 and the storage medium 104 under the control of the host I/F controller 101 to/from the data buffer 103. The data buffer controller 102 also transfers user data from the storage medium 104 to the data buffer 103 as well as from the data buffer 103 to the storage medium 104 under the control of the MPU 105.

The data buffer 103 comprises a user area 103a and a system area 103b. The user area 103a temporarily stores user data exchanged between the host device 200 and the storage medium 104 while power is ON. The system area 103b is used by the MPU 105.

The power controller 107 controls power supply from a main power source (not illustrated) to the respective elements of the storage device 100 including the data buffer 103. When power from the main power source to the data buffer 103 is cut off, the power controller 107 controls power supply from the backup power source 108 to the respective elements of the storage device 100 including the data buffer 103. If the power supply to the respective elements of the storage device 100 is switched to the backup power source 108, the power controller 107 notifies the MPU 105 of switching to the backup power source 108.

The backup power source 108 is an auxiliary power source that can be charged/discharged and supplies power to the respective elements of the storage device 100 including the data buffer 103 when the power from the main power source to the data buffer 103 is cut off. The backup power source 108 may be an electric double layer capacitor, an electrolytic capacitor, or the like.

The storage medium 104 comprises a user area 104a and a system area 104b. User data stored in the user area 103a of the data buffer 103 is written to the user area 104a. The system area 104b is used by the MPU 105.

Figure 2:
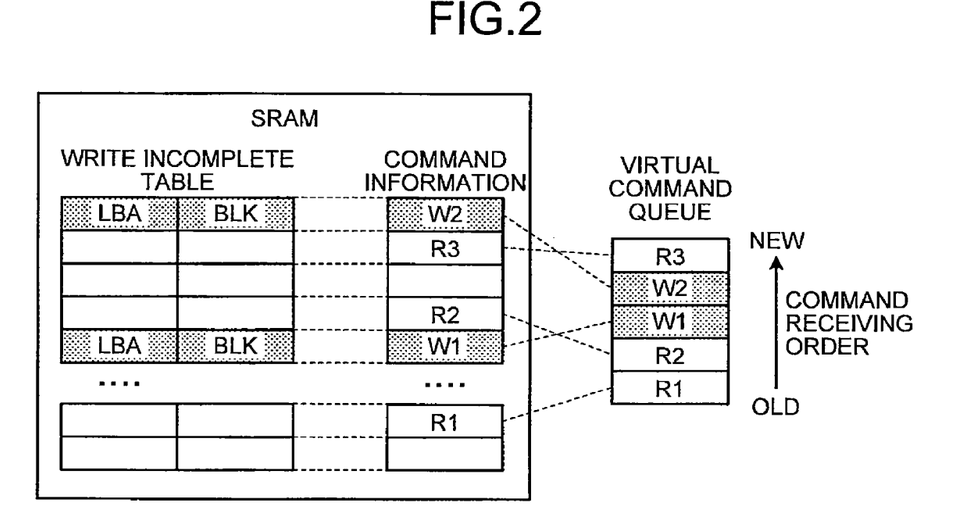
FIG. 2 is an exemplary schematic diagram of a write incomplete table stored in a memory in the embodiment.
Figure 3:
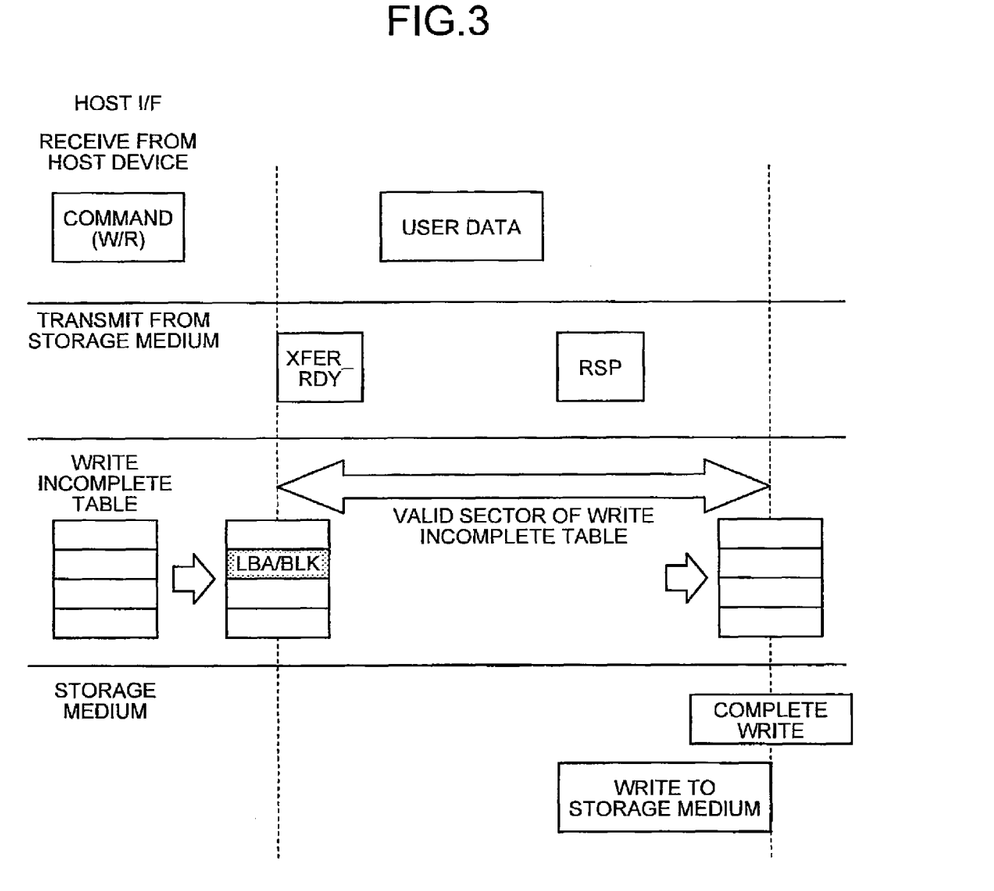
FIG. 3 is an exemplary schematic diagram for explaining the timing of updating the write incomplete table stored in the memory in the embodiment.

With reference to FIGS. 2 and 3, a description will be given of the operation of writing user data to the storage medium 104. FIG. 2 is a schematic diagram of an example of a write incomplete table stored in the memory 106. FIG. 3 is a schematic diagram for explaining the timing of updating the write incomplete table stored in the memory 106.

As illustrated in FIGS. 2 and 3, upon receipt of a write command (command W) to write user data to the storage medium 104 or a read command (command R) to read user data from the storage medium 104 from the host device 200 by controlling the host I/F controller 101, the MPU 105 generates command information indicating the content of the command from the host device 200 on the memory 106. In the embodiment, for example, the command information indicates commands received from the host device 200 in a linked list format. Accordingly, the commands indicated by the command information are not arranged in the order in which they are received.

If a user data write command is received from the host device 200, the MPU 105 controls the host I/F controller 101 to send a command (XFER_RDY) indicating that the storage medium 104 is ready for receiving user data to the host device 200 from the storage medium 104. At this time, as illustrated in FIG. 2, the MPU 105 generates a write incomplete table (write incomplete information) indicating user data stored in the user area 103a of the data buffer 103 on the memory 106. In the embodiment, as illustrated in FIG. 2, for example, the write incomplete table stores logical block addressing (LBA) and the number of blocks (BLK) in association with the address offset of the command information. The LBA specifies a sector of the storage medium 104 to which user data stored in the data buffer 103 is to be written. The BLK specifies the length of the sector (transfer length) to which the user data stored in the data buffer 103 is to be written. This reduces the load of the MPU 105 to allocate or release LBA and BLK with respect to the write incomplete table, and the like. Thus, it is possible to minimize the effect on the performance of the MPU 105 to write user data to the storage medium 104.

As illustrated in FIG. 3, after the write incomplete table is generated, the host I/F controller 101 receives user data from the host device 200. The host I/F controller 101 then controls the data buffer controller 102 to store the user data in the user area 103a of the data buffer 103. Thereafter, the MPU 105 controls the host I/F controller 101 to send a command (RSP) to the host device 200 to notify the host device 200 of the completion of the user data write command (command W). The host I/F controller 101 notifies the MPU 105 that the user data has been stored in the data buffer 103. After that, the MPU 105 controls the data buffer controller 102 to write the user data stored in the user area 103*a* to the user area 104*a* of the storage medium 104.

After the user data has been written to the storage medium 104, as illustrated in FIG. 3, the MPU 105 invalidates the LBA and the BLK stored in the write incomplete table. With this, by referring to the write incomplete table on the memory 106, the MPU 105 can check user data yet to be written at the point. As described above, the write incomplete table is generated upon receipt of the user data write command. This is to prevent such an event that even if the command (RSP) is sent to the host device 200 to notify the host device 200 of the completion of the user data write command (command W), this is not reflected in the write incomplete table.

Figure 4:
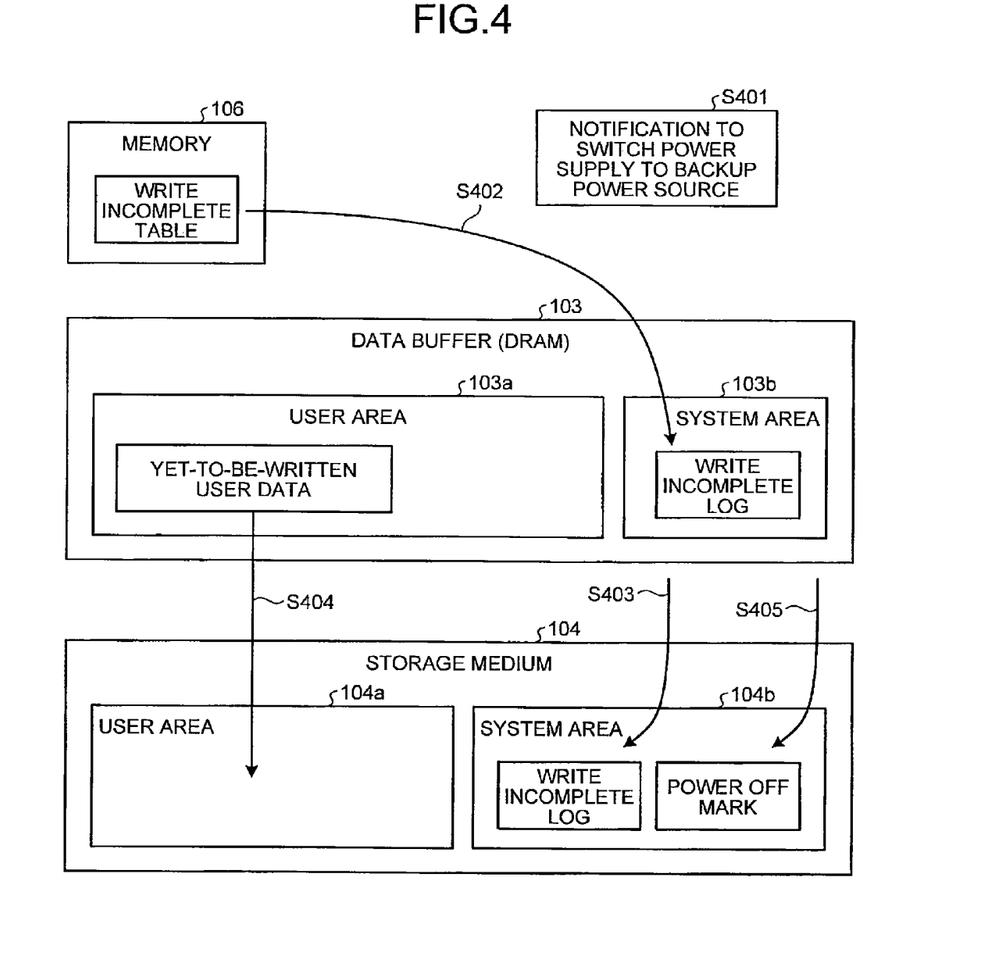
FIG. 4 is an exemplary schematic diagram for explaining the flow of operation to write user data to a storage medium when power to a data buffer is cut off in the embodiment.
Figure 5:
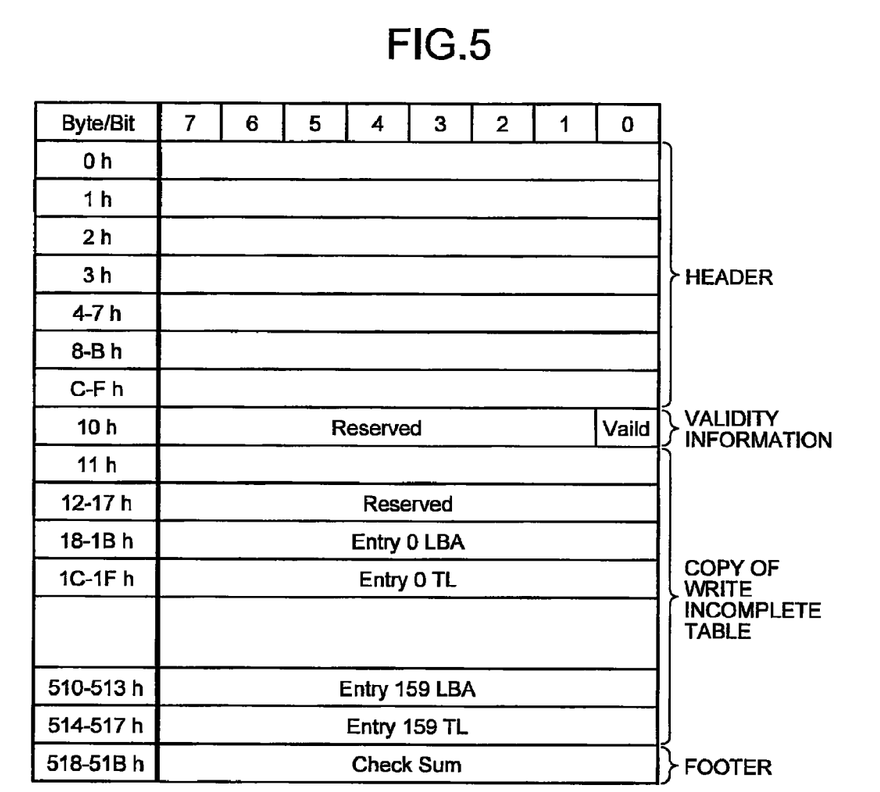
FIG. 5 is an exemplary schematic diagram of the write incomplete table generated on the data buffer and a write incomplete log including validity information indicating whether the write incomplete table is valid or invalid in the embodiment.
Figure 6:
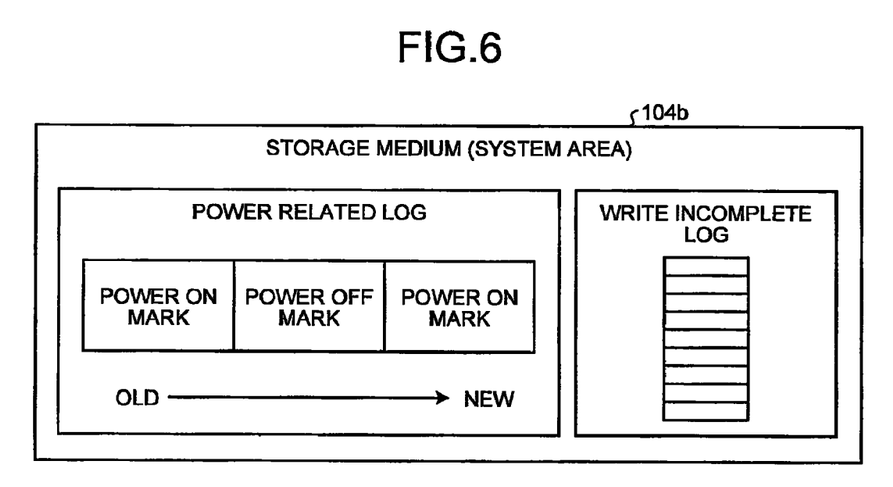
FIG. 6 is an exemplary schematic diagram of information written to the system area of the storage medium in the embodiment.

With reference to FIGS. 4 to 6, a description will be given of the operation of writing user data to the storage medium 104 when power to the data buffer 103 is cut off. FIG. 4 is a schematic diagram for explaining the flow of operation to write user data to the storage medium 104 when power to the data buffer 103 is cut off. FIG. 5 is a schematic diagram of an example of the write incomplete table generated on the data buffer 103 and a write incomplete log including validity information indicating whether the write incomplete table is valid or invalid. FIG. 6 is a schematic diagram of an example of information written to the system area 104*b* of the storage medium 104.

When the power controller 107 outputs a notification to switch the power supply to the backup power source 108 (S401), the MPU 105 is supplied with power from the backup power source 108, and generates a write incomplete log including a copy of the write incomplete table generated on the memory 106 in the system area 103*b* of the data buffer 103 (S402). As illustrated in FIG. 5, the write incomplete log contains a header, a copy of the write incomplete table, validity information, and a footer in units of one byte. The header stores information related to the write incomplete log. The validity information indicates whether the write incomplete table is valid or invalid. The footer stores an error detection code to detect errors in the write incomplete log, and the like. In the embodiment, when notified of switching to the backup power source 108, the MPU 105 writes the validity information to the write incomplete log. The validity information has a valid bit indicating by a single bit whether the write incomplete table is valid "1" or invalid "0". The MPU 105 then copies the write incomplete table generated on the memory 106 to the write incomplete log, thereby generating the write incomplete log.

After generating the write incomplete log, as illustrated in FIG. 6, the MPU 105 writes the generated write incomplete log to the system area 104*b* of the storage medium 104 (S403). Then, the MPU 105 writes yet-to-be-written user data stored in the user area 103*a* of the data buffer 103 to the user area 104*a* of the storage medium 104 (S404). In this manner, the write incomplete log is written before the user data. This is because, even if power from the backup power source 108 is cut off during the write operation of the user data due to the deterioration of the backup power source 108 or the like, if at least the write incomplete log is written to the system area 104*b* of the storage medium 104, it is possible to specify user data reading of which causes data corruption by referring to the write incomplete log when the storage device 100 is rebooted.

Having written all the user data stored in the user area 103*a* of the data buffer 103 to the user area 104*a* of the storage medium 104, the MPU 105 (write module) writes a power off mark (power off information) indicating that power from the main power source is cut off to the system area 104*b* of the storage medium 104 (S405). In the embodiment, for example, the MPU 105 writes the write incomplete log, in which power on marks indicating that power is supplied from the main power source and power off marks are recorded in time series, to the system area 104*b* of the storage medium 104. Accordingly, if power from the backup power source 108 to the data buffer 103 is cut off due to the deterioration of the backup power source 108 before the user data stored in the user area 103*a* of the data buffer 103 is written to the user area 104*a* of the storage medium 104, the MPU 105 does not write the power off mark to the write incomplete log.

Figure 7:
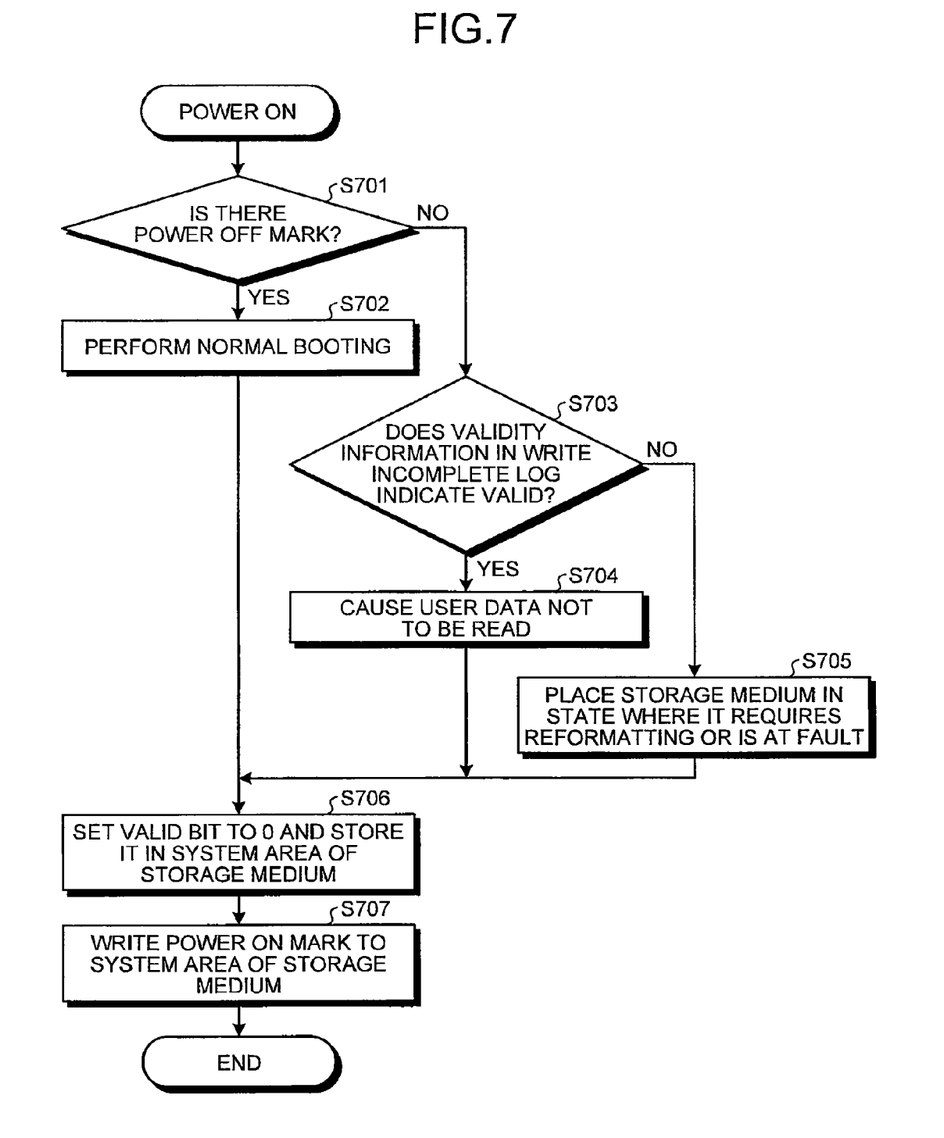
FIG. 7 is an exemplary flowchart of a process when power is again supplied from a main power source to a storage device in the embodiment.

With reference to FIG. 7, a description will be given of a process when power is again supplied from the main power source to the storage device 100. FIG. 7 is a flowchart of the process when power is again supplied from the main power source to the storage device 100.

When power is supplied from the main power source to the storage device 100, the MPU 105 first reads power related log stored in the system area 104*b*. The MPU 105 checks whether a power off mark is written to the end of the power related log (S701). If a power off mark is written (Yes at S701), the MPU 105 determines that when power from the main power source to the data buffer 103 is cut off, user data stored in the user area 103*a* is written to the user area 104*a*. Thus, the MPU 105 performs normal booting and allows all user data written to the user area 104*a* to be read (S702).

On the other hand, if a power off mark is not written to the end of the power related log (No at S701), the MPU 105 reads the write incomplete log from the system area 104*b*, and determines whether the validity information contained in the write incomplete log indicates valid, i.e., whether the valid bit is "1" (S703). If the validity information indicates valid (Yes at S703), the MPU 105 determines that user data may not be completely written to the user area 104*a* indicated by LBA and BLK stored in the write incomplete table of the write incomplete log. The MPU 105 (inhibition module) causes user data not to be read properly by, for example, rewriting the cyclic redundancy check (CRC) of the user data written to the user area 104*a* (target area) indicated by LBA and BLK stored in the write incomplete table, thereby inhibiting the reading of the user data (S704). If the host device 200 has a redundant array of independent disks (RAID) mechanism, in response to a user data read command from the host device 200, the MPU 105 may return error thereto via the host I/F controller 101, and wait for the receipt of a correct user data read command from the host device 200. With this, it is possible to minimize the effect of user data corruption due to accidental failure such as the deterioration of the backup power source 108.

On the other hand, if the validity information contained in the write incomplete log indicates invalid (No at S703), the MPU 105 (inhibition module) determines that, when power from the main power source is cut off, even valid information cannot be written to the write incomplete log. Accordingly, to prevent corruption of the user data written to the user area 104*a*, the MPU 105 places the storage medium 104 in the state where it requires reformatting or is at fault, thereby inhibiting the reading of all the user data written to the user area 104*a* (S705).

Lastly, the MPU 105 invalidates valid information contained in the write incomplete log written to the system area 104*b*, i.e., sets the valid bit to "0" (zero), as common process to the cases of S702, S704, and S705 (S706), and writes a power on mark to the write incomplete log (S707).

In the following, user data write operation in the storage device 100 of the embodiment will be compared with user data write operation in a conventional storage device. It is assumed herein that, in the storage device such as SSD comprising a backup power source, the capacity of the data buffer to store user data is 4 megabytes (MB), the amount of user data that can be written to the NAND memory at once by channel parallel access is 256 kilobytes (kB), and the time required to write the NAND memory is 750 microseconds (µs).

In the conventional storage device, if not provided with a backup power source capable of supplying power to the data buffer for 12000 µs (4 MB/256 kB×750 µs) or more, user data stored in the data buffer cannot be written to the NAND memory when power form the main power source is cut off. Therefore, if the backup power source is deteriorated, when power is supplied from the main power source, it is not possible to access all user data written to the NAND memory.

On the other hand, in the storage device 100 of the embodiment, the backup power source 108 is only required to be capable of supplying power to the data buffer 103 for the time taken to perform additional process when power form the main power source is cut off (generation of a write incomplete log in the system area 103*b* and writing of the write incomplete log to the system area 104*b*). Accordingly, if the time taken to write data to the data buffer 103 is 4 bytes/2 µs and the number (entries) of LBAs and BLKs stored in the write incomplete table is 160, the time required to generate a write incomplete log is about 640 µs. Besides, the time required to write the write incomplete log to the system area 104*b* before writing user data is 750 µs. Accordingly, if the backup power source 108 is capable of supplying power to the data buffer 103 for 1390 µs (640 µs+750 µs) when power form the main power source is cut off, all user data stored in the storage medium 104 is prevented from being lost.

That is, with the storage device 100 of the embodiment, although the time taken to perform additional process varies depending on the time taken to generate the write incomplete log in the data buffer 103, there is no need to supply power from the backup power source 108 to the data buffer 103 for the time (12000 µs or more) required to write all user data stored in the data buffer 103 to the storage medium 104. As a result, basically, as user data to be written to the user area 104*a* increases, the storage device 100 of the embodiment can achieve a greater effect than the conventional storage device. The storage device 100 of the embodiment writes user data stored in the data buffer 103 to the storage medium 104 in the same manner as the conventional storage device. Thus, the storage device 100 can generate a write incomplete log in the system area 103*b* and writes the write incomplete log to the system area 104*b* without affecting the performance to write user data to the storage medium 104.

As described above, the storage device 100 of the embodiment comprises the data buffer 103, the backup power source 108, and the storage medium 104. The data buffer 103 stores user data while power is ON. The backup power source 108 can be charged/discharged and supplies power to the data buffer 103 when power from the main power source to the data buffer 103 is cut off. The user data stored in the data buffer 103, a write incomplete table indicating the user data stored in the data buffer 103, and a power off mark indicating that power from the main power source is cut off are written to the storage medium 104.

If power from the main power source to the data buffer 103 is cut off, the MPU 105 is supplied with power from the backup power source 108 and writes a write incomplete log including the write incomplete table to the storage medium 104. After completion of writing the write incomplete log, the MPU 105 writes the user data stored in the data buffer 103 to the storage medium 104. After writing the user data, the MPU 105 writes the power off mark to the storage medium 104.

Thereafter, if a power off mark is not written to the storage medium 104 when power is supplied from the main power source to the data buffer 103, the MPU 105 inhibits the reading of the user data indicated by the write incomplete table in the write incomplete log from the storage medium 104.

With this, if user data stored in the data buffer 103 cannot be written to the storage medium 104 when power from the backup power source 108 to the data buffer 103 is cut off due to the deterioration of the backup power source 108 or the like, among user data written to the storage medium 104, only user data indicated by the write incomplete table is made inaccessible. Thus, almost any area of the storage medium 104 storing user data is accessible.

According to the embodiment, the storage device 100 does not incur a cost increase due to the additional circuit to prevent corruption of user data read from the storage medium 104, and the like. Besides, the amount of data (write incomplete table, etc.) additionally stored in the data buffer 103 and the storage medium 104 is less (for example, if the write incomplete table contains 160 entries, the data amount is about 8 bytes×160=1.3 kB).

While the memory 106, which stores the write incomplete table until user data stored in the user area 103*a* of the data buffer 103 is written to the user area 104*a* of the storage medium 104, is described in the above embodiment as SRAM, it is not limited thereto. The memory 106 may be any small capacity memory capable of storing at least the write incomplete table. For example, the memory 106 to store the write incomplete table may be a small capacity memory such as a magnetic random access memory (MRAM) that is smaller in capacity and faster than SRAM. In this case, the write incomplete table can be stored in a small capacity memory smaller in capacity than SRAM. Thus, it is possible to prevent the loss of all user data when the backup power source 108 is completely broken down (in the case of not deterioration but unexpected failure of the backup power source 108) at low cost. As in the case where the memory 106 is SRAM, the MPU 105 generates a write incomplete table on the MRAM. When the power controller 107 outputs a notification to switch the power supply to the backup power source 108, the MPU 105 generates a write incomplete log including a copy of the write incomplete table stored in the MRAM on the system area 103*b* of the data buffer 103. The MPU 105 then writes the generated write incomplete log to the system area 104*b* of the storage medium 104.

As described above, according to the embodiment, in the case where power that can be supplied from the backup power source 108 to the data buffer 103 reduces due to the deterioration of the backup power source 108 or the like, even if power from the backup power source 108 to the data buffer 103 is cut off and user data stored in the data buffer 103 cannot be written to the storage medium 104, almost any area of the storage medium 104 storing user data is accessible without corruption of the user data.

A computer program may be executed on a computer to realize the same function as the storage device 100. The computer program may be provided as being stored in advance in ROM or the like. The computer program may also be provided as being stored in a computer-readable storage medium, such as a compact disc-read only memory (CD-ROM), a flexible disk (FD), a compact disc recordable (CD-R), and a digital versatile disc (DVD), as a file in an installable or executable format.

The computer program may also be stored in a computer connected via a network such as the Internet so that it can be downloaded therefrom via the network. Further, the computer program may be provided or distributed via a network such as the Internet.

While the above elements (the write module, the inhibition module, etc.) are described herein as being implemented by hardware, they may be implemented by the MPU 105 executing the computer program. More specifically, the computer program comprises modules that implement the above elements (the write module, the inhibition module, etc.). As real hardware, the MPU 105 (processor) loads the computer program from the ROM as described above into the main memory and executes it. With this, the write module, the inhibition module, and the like are implemented on the main memory.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A storage device comprising:
a volatile memory configured to store user data;
an auxiliary power source configured to supply power to the volatile memory when power from a main power source to the volatile memory is cut off;
a nonvolatile memory configured to be written with the user data stored in the volatile memory, write incomplete information indicating the user data stored in the volatile memory, and power off information indicating that power from the main power source is cut off;
a write module configured to be supplied with power from the auxiliary power source when power from the main power source is cut off, to write the write incomplete information to the nonvolatile memory, to write the user data stored in the volatile memory to the nonvolatile memory after writing the write incomplete information, and to write the power off information to the nonvolatile memory after writing the user data; and
an inhibition module configured to, if the power off information is not written in the nonvolatile memory when the volatile memory is supplied with power from the main power source, inhibit the user data indicated by the write incomplete information from being read from the nonvolatile memory.

2. The storage device of claim 1, wherein
the write module is configured to write validity information indicating whether the write incomplete information is valid or invalid to the nonvolatile memory, and
if the validity information indicates invalid, the inhibition module is configured to inhibit reading of all user data written in the nonvolatile memory.

3. The storage device of claim 2, further comprising a memory configured to be capable of storing at least the write incomplete information until the user data stored in the volatile memory is written in the nonvolatile memory, wherein
if power from the main power source to the volatile memory is cut off, the write module is configured to write the write incomplete information stored in the memory to the nonvolatile memory.

4. The storage device of claim 2, wherein the auxiliary power source is configured to be charged and discharged.

5. The storage device of claim 1, further comprising a memory configured to be capable of storing at least the write incomplete information until the user data stored in the volatile memory is written in the nonvolatile memory, wherein
if power from the main power source to the volatile memory is cut off, the write module is configured to write the write incomplete information stored in the memory to the nonvolatile memory.

6. The storage device of claim 5, wherein the auxiliary power source is configured to be charged and discharged.

7. The storage device of claim 1, wherein the auxiliary power source is configured to be charged and discharged.

8. An electronic device comprising:
a host device configured to transmit user data;
a volatile memory configured to store the user data received from the host device;
an auxiliary power source configured to supply power to the volatile memory when power from a main power source to the volatile memory is cut off;
a nonvolatile memory configured to be written with the user data stored in the volatile memory, write incomplete information indicating the user data stored in the volatile memory, and power off information indicating that power from the main power source is cut off;
a write module configured to be supplied with power from the auxiliary power source when power from the main power source is cut off, to write the write incomplete information to the nonvolatile memory, to write the user data stored in the volatile memory to the nonvolatile memory after writing the write incomplete information, and to write the power off information to the nonvolatile memory after writing the user data; and
an inhibition module configured to, if the power off information is not written in the nonvolatile memory when the volatile memory is supplied with power from the main power source, inhibit the user data indicated by the write incomplete information from being read from the nonvolatile memory.

9. The electronic device of claim 8, wherein
the write module is configured to write validity information indicating whether the write incomplete information is valid or invalid to the nonvolatile memory, and
if the validity information indicates invalid, the inhibition module is configured to inhibit reading of all user data written in the nonvolatile memory.

10. The electronic device of claim 9, further comprising a memory configured to be capable of storing at least the write incomplete information until the user data stored in the volatile memory is written in the nonvolatile memory, wherein
if power from the main power source to the volatile memory is cut off, the write module is configured to write the write incomplete information stored in the memory to the nonvolatile memory.

11. The electronic device of claim 9, wherein the auxiliary power source is configured to be charged and discharged.

12. The electronic device of claim 8, further comprising a memory configured to be capable of storing at least the write incomplete information until the user data stored in the volatile memory is written in the nonvolatile memory, wherein
if power from the main power source to the volatile memory is cut off, the write module is configured to write the write incomplete information stored in the memory to the nonvolatile memory.

13. The electronic device of claim 12, wherein the auxiliary power source is configured to be charged and discharged.

14. The electronic device of claim 8, wherein the auxiliary power source is configured to be charged and discharged.

15. A method of controlling a storage device comprising a volatile memory configured to store user data, an auxiliary power source configured to supply power to the volatile memory when power from a main power source to the volatile memory is cut off, a nonvolatile memory configured to be written with the user data stored in the volatile memory, write incomplete information indicating the user data stored in the volatile memory, and power off information indicating that power from the main power source is cut off, and a controller, the method comprising:

writing the write incomplete information to the nonvolatile memory, writing the user data stored in the volatile memory to the nonvolatile memory after writing the write incomplete information, and writing the power off information to the nonvolatile memory after writing the user data by the controller that is supplied with power from the auxiliary power source when power from the main power source is cut off; and     inhibiting the user data indicated by the write incomplete information from being read from the nonvolatile memory by the controller if the power off information is not written in the nonvolatile memory when the volatile memory is supplied with power from the main power source.

16. The method of claim 15, wherein
the writing includes writing validity information indicating whether the write incomplete information is valid or invalid to the nonvolatile memory, and
if the validity information indicates invalid, reading of all user data written in the nonvolatile memory is inhibited at the inhibiting.

17. The method of claim 16, further comprising storing at least the write incomplete information until the user data stored in the volatile memory is written in the nonvolatile memory, wherein
    if power from the main power source to the volatile memory is cut off, the write incomplete information stored in the memory is written to the nonvolatile memory at the writing.

18. The method of claim 16, wherein the auxiliary power source is configured to be charged and discharged.

19. The method of claim 15, further comprising storing at least the write incomplete information until the user data stored in the volatile memory is written in the nonvolatile memory, wherein
    if power from the main power source to the volatile memory is cut off, the write incomplete information stored in the memory is written to the nonvolatile memory at the writing.

20. The method of claim 15, wherein the auxiliary power source is configured to be charged and discharged.

* * * * *